(12) United States Patent
Iwata et al.

(10) Patent No.: US 7,397,534 B2
(45) Date of Patent: Jul. 8, 2008

(54) EXPOSURE APPARATUS AND DEVICE MANUFACTURING METHOD

(75) Inventors: Naohiko Iwata, Kumagaya (JP);
Hideaki Sakamoto, Kumagaya (JP);
Masaya Iwasaki, Ageo (JP); Ken Hattori, Okegawa (JP); Masato Takahashi, Namegawa-machi (JP);
Yutaka Endo, Kumagaya (JP); Yasuo Araki, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/285,604

(22) Filed: Nov. 23, 2005

(65) Prior Publication Data
US 2006/0077368 A1    Apr. 13, 2006

Related U.S. Application Data

(63) Continuation of application No. PCT/JP2004/007445, filed on May 25, 2004.

(30) Foreign Application Priority Data

May 27, 2003    (JP) .............................. 2003-148665
Apr. 14, 2004    (JP) .............................. 2004-118861

(51) Int. Cl.
*G03B 27/42*    (2006.01)
*G03B 27/52*    (2006.01)
*G03B 27/62*    (2006.01)

(52) U.S. Cl. .............................. 355/53; 355/30; 355/75

(58) Field of Classification Search .................. 355/53, 355/72–75, 30; 310/10
See application file for complete search history.

(56) References Cited

U.S. PATENT DOCUMENTS

| | | | |
|---|---|---|---|
| 5,155,523 A * | 10/1992 | Hara et al. ..................... 355/53 |
| 5,172,160 A | 12/1992 | Van Eijk et al. | |
| 5,559,329 A * | 9/1996 | Joseph et al. ................ 250/306 |
| 5,691,806 A * | 11/1997 | Tokuda et al. ................. 355/72 |
| 5,781,277 A * | 7/1998 | Iwamoto ....................... 355/53 |
| 5,822,133 A * | 10/1998 | Mizuno et al. .............. 359/696 |
| 6,151,105 A * | 11/2000 | Lee .............................. 355/75 |
| 6,330,052 B1 | 12/2001 | Yonekawa et al. | |
| 6,396,566 B2 * | 5/2002 | Ebinuma et al. .............. 355/53 |
| 6,741,332 B2 * | 5/2004 | Nishi ........................... 355/72 |
| 6,774,981 B1 * | 8/2004 | Watson et al. ................. 355/53 |
| 6,791,644 B2 | 9/2004 | Toda | |
| 6,853,443 B2 | 2/2005 | Nishi | |

(Continued)

FOREIGN PATENT DOCUMENTS

JP    A-03-214721    9/1991

(Continued)

*Primary Examiner*—Alan A Mathews
(74) *Attorney, Agent, or Firm*—Oliff & Berridge, PLC

(57) ABSTRACT

The exposure system comprises a projection optical system that irradiates exposure light emitted from a mask onto a substrate, a first support member that supports the projection optical system, and a support structure that supports the first support member, wherein the support member supports the first support member at a position that is higher than the position at which the first support member supports the projection optical system.

14 Claims, 4 Drawing Sheets

U.S. PATENT DOCUMENTS

| | | | |
|---|---|---|---|
| 2001/0017890 A1* | 8/2001 | Rhee | 375/240.16 |
| 2002/0017890 A1 | 2/2002 | Ebihara et al. | |
| 2002/0044269 A1 | 4/2002 | Yonekawa et al. | |
| 2002/0048003 A1* | 4/2002 | Haney et al. | 355/30 |
| 2002/0080339 A1* | 6/2002 | Takahashi | 355/72 |
| 2002/0102481 A1* | 8/2002 | Lee et al. | 430/9 |
| 2002/0163631 A1* | 11/2002 | Sogard | 355/74 |
| 2003/0030779 A1* | 2/2003 | Hara | 355/53 |
| 2004/0156026 A1* | 8/2004 | Kamiya | 355/30 |

FOREIGN PATENT DOCUMENTS

| | | |
|---|---|---|
| JP | A-05-121294 | 5/1993 |
| JP | A-09-106944 | 4/1997 |
| JP | A-11-307438 | 11/1999 |
| JP | A-2000-269118 | 9/2000 |
| JP | A 2002-305140 | 10/2002 |
| JP | A-2003-068623 | 3/2003 |
| JP | A-2003-120747 | 4/2003 |

* cited by examiner

EXPOSURE APPARATUS AND DEVICE MANUFACTURING METHOD

TECHNICAL FIELD

The present invention relates to an exposure apparatus used in the transfer process among lithographic processes for manufacturing large-scale integrated semiconductor circuit elements.

Priority is claimed on Japanese Patent Application No. 2003-148665, filed on May 27, 2003, and Japanese Patent Application No. 2004-118861 filed on Apr. 14, 2004, the content of which is incorporated herein by reference.

This application is a continuation application based on PCT/JP2004/007445 designating U.S.A.

BACKGROUND ART

Various kinds of exposure apparatus are used in lithographic processes for manufacturing semiconductor elements and so forth. Step-and-repeat type projection apparatuses, such as step-and-repeat type projection exposure apparatuses (so-called "stepper"), and step-and-scan type projection exposure apparatuses (so-called "scanning stepper") form the mainstream of exposure apparatuses.

With the advancement of large-scale integration and higher speeds of CPU processors and larger capacities of semiconductor memory, the demand for fine patterning of resists formed on wafers has been rapidly increasing, and higher exposure precision is becoming a requirement in such exposure apparatuses. Such apparatuses are used in the mass production of devices, and consequently, high throughput is also being demanded as a requirement in exposure apparatuses. The exposure precision and the throughput have been improved by enhancing the resolving power by increasing the numerical aperture (NA) of a projection optical system and by using shorter exposure wavelengths of the exposure light, by improving the position controllability and increasing the acceleration of the reticle stage or the wafer stage.

However, the shape and the weight of the projection optical system are enlarged when the NA of the projection optical system is increased, and vibrations increase when the acceleration of the reticle stage is increased. Thus, the increase in vibrations is suppressed by modifying the configuration of frames that supports the projection optical system, stages and the like, by elaborating displacement of vibration suppression devices, and the like, as disclosed in Japanese Unexamined Patent Application, First Publication No. 2002-305140.

However, the aforementioned techniques are directed to suppressing the occurrence of vibrations, and are not directed to directly improving the rigidity of the frames. Accordingly, to support the further increase in the NA of the projection optical system and the increase in the acceleration of the stage, the frames necessarily have to be made larger. There is, however, a limit on increasing the size of the frames because of restrictions in the installation location and the transportation of the exposure apparatus.

If the acceleration of the stage and the NA of the projection optical system are improved in order to form fine patterns, the rigidity of the frames is reduced relatively compared to the conventional case. As a result, the vibrations increase, and instead, the formation of fine patterns becomes difficult, which present a problem.

DISCLOSURE OF THE INVENTION

The present invention has been made in consideration of the above circumstances, and it is an object to provide an exposure apparatus that can form fine patterns with an increased NA of a projection optical system and increased acceleration of a stage by providing compact and highly rigid frames without causing significant increase in the size of the exposure apparatus.

In the present invention, the following measures are adapted for resolving the aforementioned issues.

A first aspect of the present invention is an exposure apparatus comprising a projection optical system that irradiates exposure light emitted from a mask onto a substrate, a first support member that supports the projection optical system (30), and a support structure that supports the first support member (110), in which the position at which the support structure supports the first support member is higher than the position at which the first support member supports the projection optical system. According to this aspect, the first support member is formed in an approximately inversed arch shape, therefore, the vibration of the projection optical system can be reduced, thus enabling the rigidity of the main frames composed of the first support member as a component to be enhanced, and enabling high rigidity to be obtained in the support structure.

The position at which the support structure supports the first support member is approximately at the same height as the position of the center of gravity of the projection optical system. Thus, the position at which the supporting force is applied on the first support member is at approximately the same height as the center of gravity of the projection optical system. This enables the distance between the position at which the supporting force is applied and the position of the center of gravity of the projection optical system to be minimized; therefore, the deformation of the first support member can be suppressed to a minimum.

The support structure comprises a vibration suppression device and the first support member is supported via the vibration suppression device. Thus, the occurrence of vibration that rotates the optical projection system around the center of gravity is suppressed, and the vibration of the first support member can be suppressed easily and effectively by the vibration suppression device.

A sensor support is further provided on which a sensor for the projection optical system is disposed. When the sensor support is disposed on the underside of the first support member, it need not support the projection optical system, which has generally becoming increased in size, and because the sensor support is inappropriate as a support structure. Thus, the rigidity of the exposure apparatus can be increased and at the same time, the first support member can be made more compact.

A mask stage that retains the mask and a second support member that supports the mask stage are also provided in which the second support member is connected to the first support member at the position where the support structure supports the first structural member, and the second support member shaped in an approximate arch shape and the first support member shaped in an approximate inversed arch shape, are connected, enabling the rigidity of the main frame formed by the connection of the first support member and the second support member to be increased.

Since the first support member is heavier than the second support member, the center of gravity of the main frame can be lowered.

By using for the first support member, a material with a higher specific gravity than that of the second support member, the weight of the first support member can be easily made heavier than the weight of the second support member.

By using a metal matrix composite material for the second support member, the second support member can be made highly rigid and at the same time lighter.

By providing a temperature regulating unit in at least one of the first support member and the second support member, the temperature of the first support member and/or the second support member can be maintained constant, and the effects of the ambient temperature can be minimized.

The support structure further comprises a bed that supports a substrate stage, and a plurality of supporting pillars that support the first support member, and at least one beam that connects the supporting pillars at upper parts thereof. When the beam and the position where the first support member supports the projection optical system are disposed at approximately the same height, the support structure becomes a rigid-frame structure, and the rigidity can be improved. Since the beam and the position where the optical system is supported are approximately at the same height, the opening on the side face of the support structure can be increased in size, enabling the maintenance of the substrate stage to be performed.

When the supporting pillars are divided at the central part into upper and lower parts that are connected at the central part, connecting portions of the supporting pillars can be disposed at the locations where concentration of stress due to vibration does not occur easily, enabling high rigidity of the support structure to be maintained.

A second aspect of the present invention is a device manufacturing method including a lithographic process, and the exposure apparatus according to the first invention is used in the lithographic process. In accordance with this aspect, an exposure apparatus comprising a frame structure with little vibration and which easily prevents vibration is used, therefore, the number of openings in the projection optical system can be increased and high acceleration of the stage can be realized, enabling fine resist patterns to be achieved.

BEST MODE FOR CARRYING OUT THE INVENTION

The exposure apparatus and stage apparatus according to the present invention will be described below with reference to the drawings. However, the present invention is not restricted to the embodiments described below. For example, the constituent of these embodiments may be appropriately combined.

Figure 1:
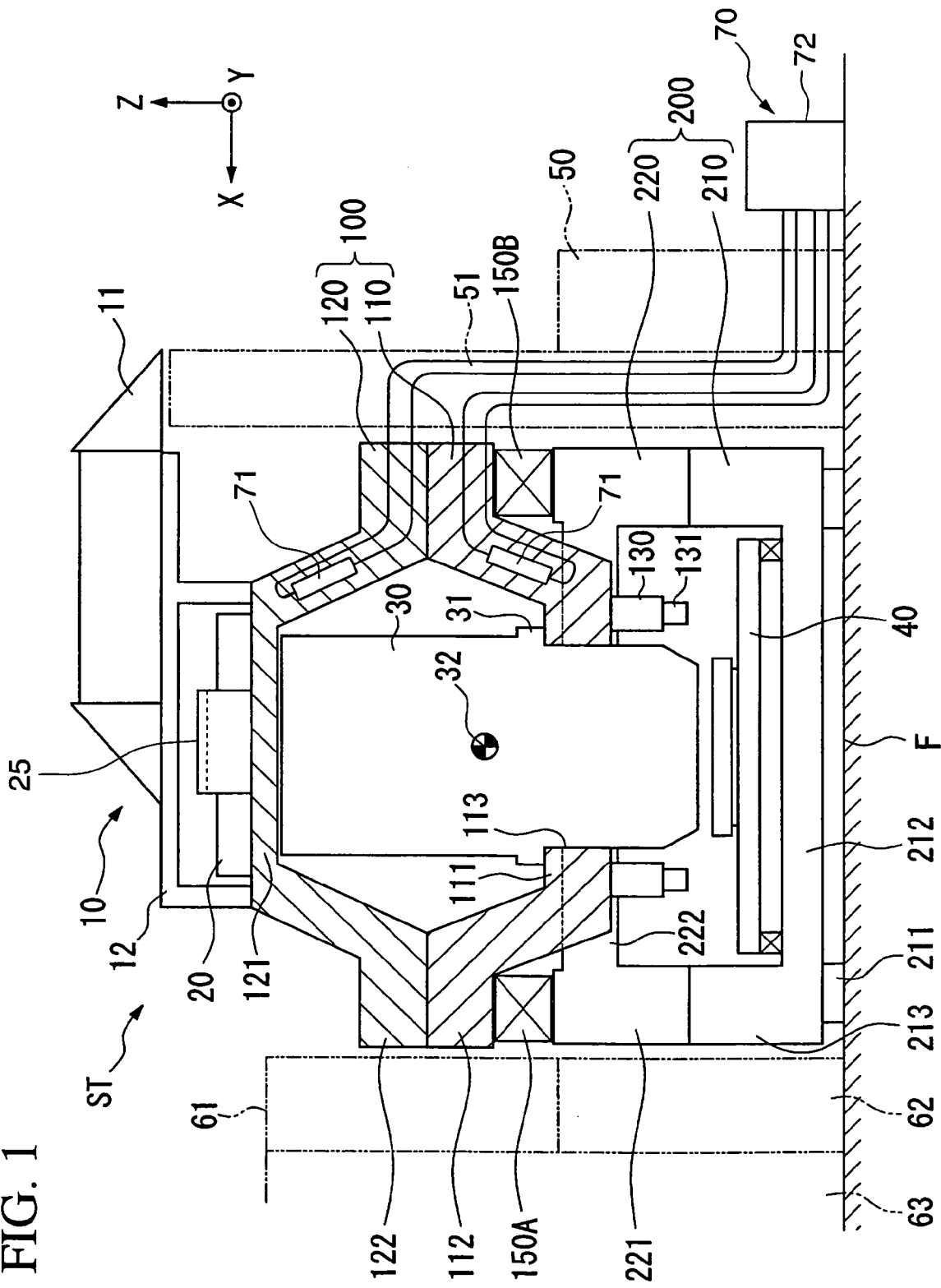
FIG. 1 is a view schematically illustrating the configuration of the exposure apparatus.

FIG. 1 is a view schematically illustrating the configuration of a exposure apparatus ST.

The exposure apparatus ST is a step-and-scan type scanning exposure apparatus, that is, a so-called scanning stepper, in which a circuit pattern formed on a reticle (mask) is transferred to each shot area on a wafer (substrate) through a projection optical system 30 while moving a reticle and the wafer in synchronization along a one-dimensional direction (taken as the direction of the X-axis in FIG. 1, which is the transverse direction in the plane of the paper).

The exposure apparatus ST comprises an illuminating optical system 10 that illuminates the reticle with illuminating light from a light source 50, a reticle stage 20 that retains the reticle, a reticle alignment 25 that detects reticle alignment marks formed on the reticle and measures the position of the reticle, the projection optical system 30 that projects the illuminating light emitted from the reticle onto the wafer, a wafer stage 40 that retains the wafer, a main frame 100 that retains the reticle stage 20, the projection optical system 30 and the like, and a base frame 200 that supports the main frame 100 and the wafer stage 40.

The illuminating optical system 10 comprises optical components including a housing 11, a relay lens system disposed in the housing 11 at a specific positional relationship, a mirror that bends the light path, and a condenser lens system. The illuminating optical system 10 is supported by an illuminating system support member 12 extending vertically and fixed on the upper surface of a second frame 120 that constitutes the main frame 100.

A light source 50 and a separate part of illuminating optical system 51 are disposed on one side of the exposure apparatus ST (right side in FIG. 1) and installed separately from the exposure apparatus ST such that vibrations are not transmitted.

A laser beam emitted from the light source 50 is directed incident on the illuminating optical system 10 through the separate part of illuminating optical system 51, a cross-section shape of a laser beam is shaped, and illuminating light (exposure light) with a substantially uniform luminance distribution is irradiated onto the reticle.

The reticle stage (mask stage) 20 is floatably supported through a contactless bearing (such as a static air bearing), which is not shown, on the upper surface of the second frame 120 that constitutes the main frame 100. The reticle stage 20 comprises a reticle fine movement stage that retains the reticle, a reticle coarse movement stage that moves together with the reticle fine movement stage with a specified stroke along the X-axis direction, which is the scanning direction; and a linear motor that moves these stages.

A rectangular openings is provided in the reticle fine movement stage, and the reticle is retained by vacuum absorption or the like using a reticle absorption mechanism provided around the opening.

A laser interferometer (not shown) is provided on the end of the second frame 120. The two-dimensional position and rotating angle of the reticle fine movement stage, together with the position along the X-axis direction of the fine movement stage, are measured with high precision, and the position and speed of the fine movement stage are controlled based on the results of these measurements.

The reticle alignment 25 comprising an alignment optical system for observing the reticle retained on the reticle stage 20 and an image pickup apparatus disposed on a base member, and is provided above the reticle stage 20 so as to straddle the reticle stage 20 along the Y-axis direction, which is the non-scanning direction, and is supported by the second frame 120. A reticle alignment mark formed on the reticle is detected by the image pickup apparatus and the alignment optical system disposed on the base member. A rectangular opening is provided at a position on the base member that corresponds to the irradiated position of the laser beam from the illuminating optical system 10, and te laser beam is irradiated onto the reticle through this opening.

The base member of reticle alignment 25 on which the alignment optical system, image pickup elements and the like are disposed, is made of a non-magnetic material such as for example, austenitic stainless steel, considering the electromagnetic effects on the linear motor provided in the reticle stage 20.

The projection optical system 30 is telecentric on both the object plane side (reticle side) and the image plane side (wafer side), and employs a reducing system for scaling down at a specified projection factor β (for example, β may be ⅕). When illuminating light (ultraviolet pulse light) is irradiated from the illuminating optical system 10 onto the reticle, the image light flux from the part illuminated by the ultraviolet pulse light in the circuit pattern area formed on the reticle is incident on the projection optical system 30, and a partial inverted image of the circuit pattern is formed, which is restricted by an elongate slit shape or rectangular shape (polygon) in the Y-axis direction at the center of the field of view on the image plane side of the projection optical system 30 at every irradiation of pulse of the ultraviolet light. As a result, the partial inverted image of the projected circuit pattern is scaled down and transferred onto the resist layer of the surface of one of the shot areas among a plurality of shot areas on the wafer disposed on the image surface of the projection optical system 30.

A flange 31 is provided around the outer periphery of the projection optical system 30 to support the projection optical system 30. The flange 31 is disposed below a center of gravity 32 of the projection optical system 30 because of constraints on the design of the projection optical system 30. With the demand for fine patterning, the numerical aperture NA of the projection optical system 30 has been increasing to 0.9 or more, for instance, and with this increase, the outer diameter and the weight of the projection optical system 30 have also increased.

The projection optical system 30 is inserted in an opening 113 provided in the first frame 110 constituting the main frame 100 and is supported via flange 31.

The wafer stage (substrate stage) 40 is disposed inside the base frame 200. The wafer stage 40 moves continuously in the X-axis direction because of a linear motor or the like, and also moves in steps in the X-axis direction and in the Y-axis direction. Further, a substrate table (not shown) is provided in the wafer stage 40 to move the wafer in microscopic steps in three degrees of freedom, namely the Z-axis direction, the θx direction (rotation around the X-axis) and the θy direction (rotation around the Y-axis) for leveling and focusing the wafer.

Further, a counter-mass is provided in the wafer stage 40 for motion in a direction opposite to that of the stage so as to cancel the reaction force generated when the stage is driven.

The size and the weight of the wafer stage 40 generally show a tendency to increase with the increase in the size of the wafer (300 mm, 16 inches in diameter, and so forth).

An image of a pattern in the illuminated area of the reticle will be projected on the exposed area (the area conjugate with the illuminated area) of the slit shape on the wafer on the surface of which a resist has been coated, at the projection factor β through the projection optical system 30, under the illuminating light in the exposure apparatus ST equipped with the aforementioned configuration. In such a condition, a reticle pattern will be transferred to one of the shot areas on the wafer by moving the reticle and wafer in synchronization in the specified scanning direction (X-axis direction).

Next, the main frame 100 and the base frame 200 are described below referring to FIGS. 1 to 4.

Figure 2:
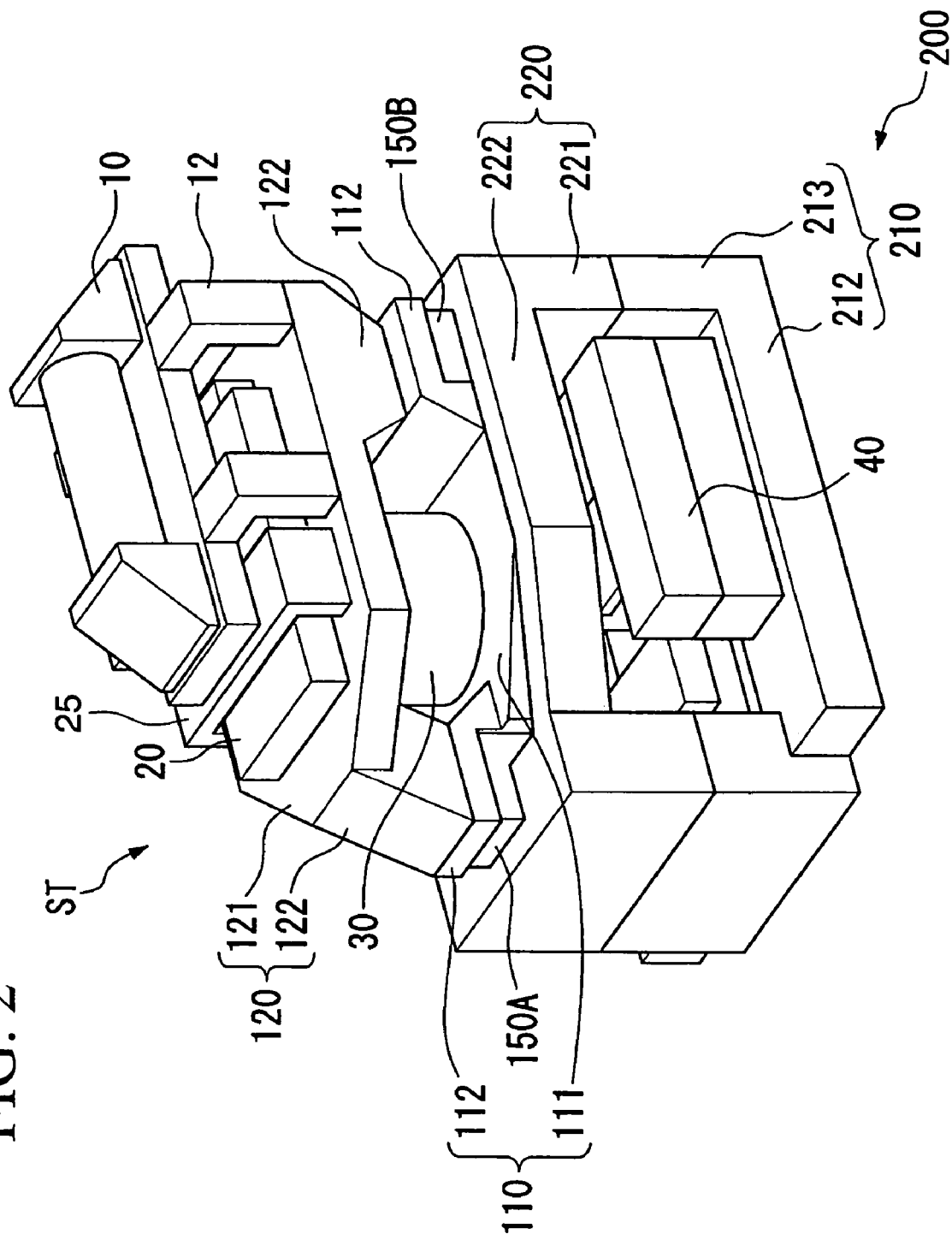
FIG. 2 is a perspective view of the exposure apparatus.
Figure 3:
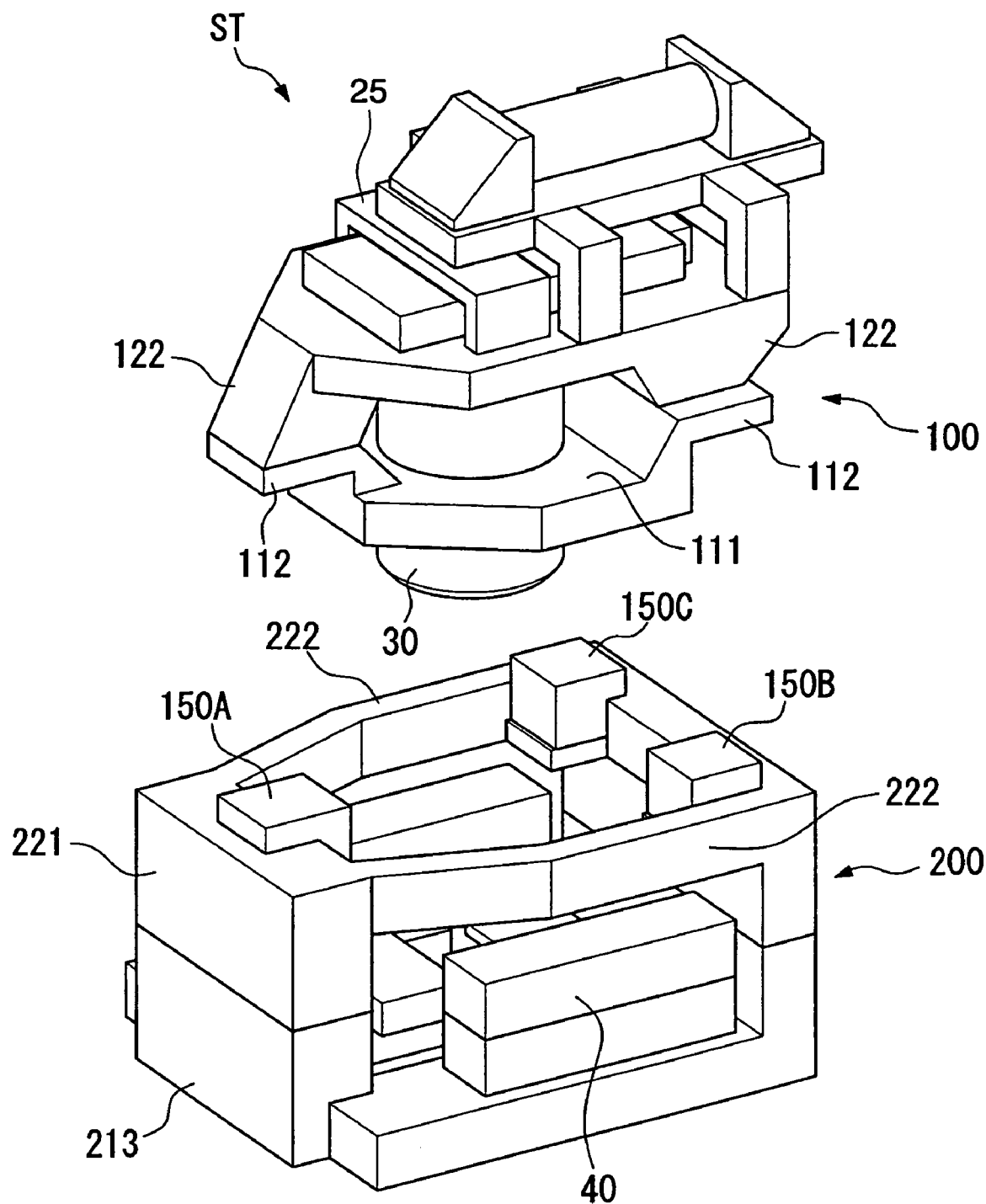
FIG. 3 is an exploded perspective view of the exposure apparatus.
Figure 4:
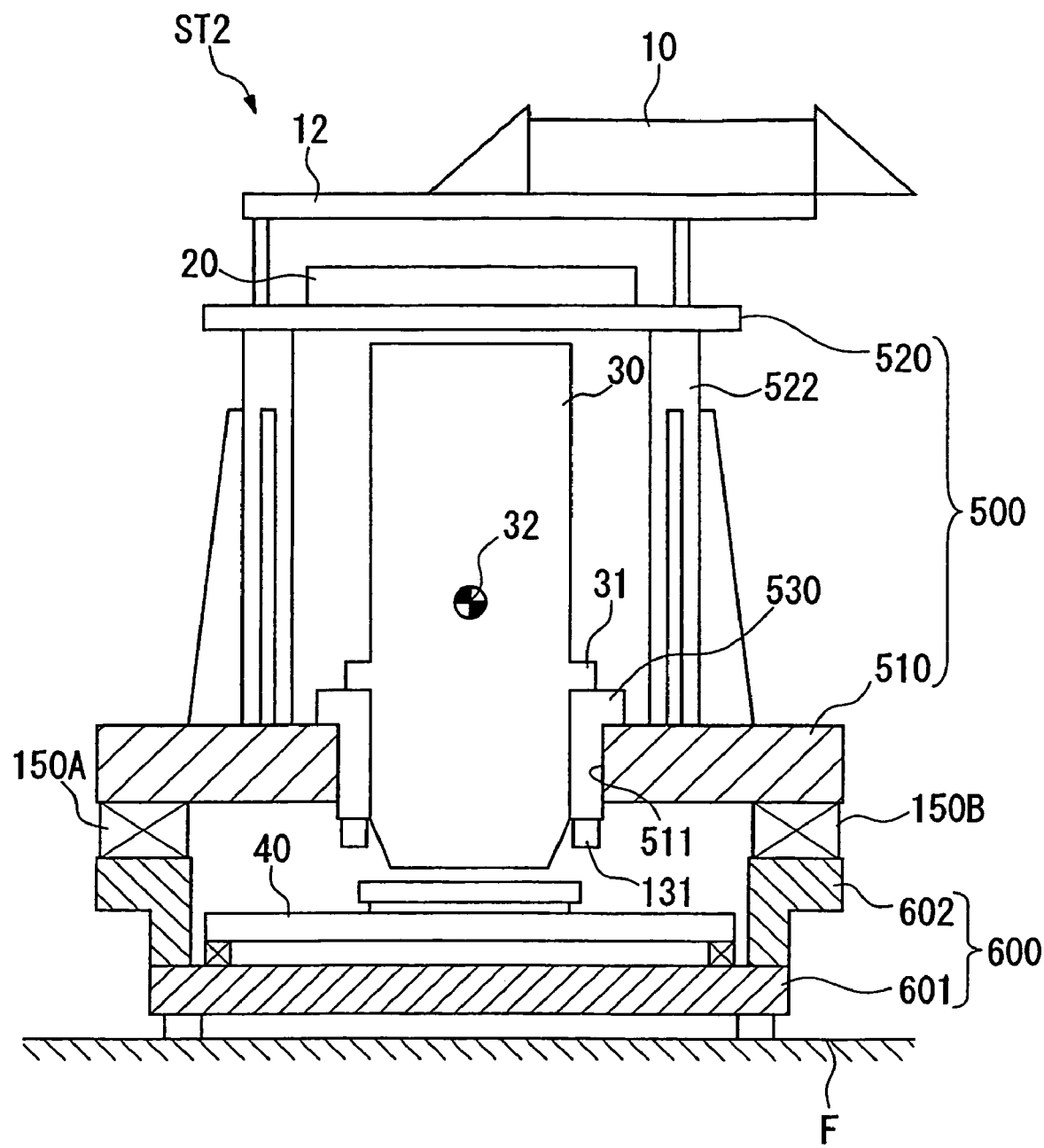
FIG. 4 is a view schematically illustrating the conventional exposure apparatus.

FIG. 1 is a view schematically illustrating the configuration of the exposure apparatus ST. FIG. 2 is a perspective view of the exposure apparatus ST, while FIG. 3 is an exploded perspective view of the exposure apparatus ST. Further, FIG. 4 is a view schematically illustrating a conventional exposure apparatus.

First, the main frame 100 comprises a first frame 110 (first support member) that supports the projection optical system 30 and the like, and a second frame 120 (second support member) that supports the reticle stage 20 disposed above the projection optical system 30.

The first frame 110 comprises a lens barrel support bed 111 provided with the opening 113 formed slightly larger than the outer diameter of the cylindrical projection optical system 30, and a first frame connecting portion 112 formed on the periphery of the lens barrel support bed 111 and above the lens barrel support bed 111 for connecting the base frame 200 and the second frame 120. Considering the stability of the first frame 110, the first frame connecting portion 112 should preferably be disposed at, but not limited to, three locations. Further, the lens barrel support bed 111 and the first frame connecting portion 112 are formed as an integral structure and are not connected by any securing member.

The projection optical system 30 is inserted in the opening 113 of the lens barrel support bed 111, and the flange 31 of the projection optical system is supported on the upper surface of the lens barrel support bed 111. Thus, when the first frame 110 is viewed from the side of the exposure apparatus ST (in the direction of the plane of the paper in FIG. 1), it is formed as an inversed arch shape and it supports the projection optical system 30.

The first frame 110 should preferably weigh more than the second frame 120 because it is required to be highly rigid as a structure and at the same time, the center of gravity of the entire main frame 100 should be made low. Therefore, the first frame 110 of this embodiment is made of FCD 450, a type of cast iron, and it weighs more than the second frame 120. FCD450 has a Young's modulus of 168 GPa, and with a rigidity suitable for the first frame 110. The specific gravity of FCD450 is 7.1, and since many kinds of structural materials with a specific gravity lower than FCD450 are available, a material with a specific gravity lower than FCD450 can be selected for the second frame 120. Thus, the weight of the first frame 110 can be easily made greater than the weight of the second frame 120. (Details of the second frame 120 are given below.)

Incidentally, the flange 31 installed in the projection optical system 30, is disposed below the center of gravity of the projection optical system 30 considering the design limitations on the projection optical system 30. Accordingly, when the projection optical system 30 is supported by a flat-plate type first frame 510 (see FIG. 4) as in the conventional case, the position of the center of gravity 32 of the projection optical system 30 will lie above the first frame 510.

For this reason, when a transverse force is applied on the first frame 110, deformation of the first frame 110 and the projection optical system 30 is likely to occur easily. Further, if transverse vibrations are applied externally, vibrations may occur that rotate the projection optical system 30 approximately around the center of gravity 32, and the vibrations of the main frame 500 may become complex.

That is, the vibrations in the transverse direction of a first frame 510 will vibrate and rotate the projection optical system 30, and become so-called coupled oscillations. Further, if the first frame 110 and the projection optical system 30 vibrate, the position of the center of rotation will vary depending on the frequency of the vibration. That is, while the center of rotation of vibration of low frequencies is near the center of gravity of the projection optical system 30, whereas the center of rotation of vibration of high frequencies is near the support position of the first frame 110. For this reason, vibration suppression control needs to be performed by vibration suppression units (vibration suppression devices) 150 (150A-150C; refer to FIG. 3) disposed between the base frame 200 and the main frame 100 assuming a different center of rotation for each frequency of vibration, which is very difficult.

Therefore, since the position of the center of gravity 32 of the projection optical system 30 and the position at which transverse vibrations are applied on the first frame 110 (position at which the base frame 200 supports the first frame 100), are disposed at approximately the same height, deformation of the first frame 110 and the projection optical system 30 can be suppressed. Further, the rotation vibration around the center of gravity 32 of the projection optical system 30 caused by transverse vibrations of the first frame 100 are also suppressed, enabling decoupling between the vibrations in the transverse direction of the first frame 110 and the rotation vibration of the projection optical system 30.

Further, since the height of the center of gravity 32 of the projection optical system 30 and the height of the support position of the first frame 110 are set such that these heights are approximately equal, the positions of the centers of rotation of vibration of all frequencies coincide approximately. As a result, measures to prevent vibration can be easily adopted, and vibrations of the exposure apparatus ST can be effectively suppressed. Since the rotation vibration of the projection optical system 30 have been reduced as mentioned above, the vibration suppression unit 150 only needs to eliminate vibrations in the translational direction and in the vertical direction, thereby making elimination of vibrations (suppression of vibrations) easy.

The second frame 120 comprises a support bed 121 that supports the reticle stage 20, and a second frame connecting portion 122 extending below the undersurface of the periphery of the support bed 121 and connected to the first frame 110. Considering the stability of the second frame 120, the second frame connecting portion 122 should preferably be disposed at, but not limited to, three locations. Further, the support bed 121 and the second frame connecting portion 122 are formed as an integral structure and are not connected by any securing member. Accordingly, the second frame 120 is formed an arch shape symmetrically into with the first frame 110.

Further, the second frame connecting portion 122 is secured to the first frame connecting portion 112 of the first frame 110 by as bolts or the like. The second frame connecting portion and the first frame connecting portion are adjusted and secured in such a manner that a specific positional relationship is formed between the projection optical system 30 supported by the first frame 110 and the reticle stage 20 supported by the second frame 120.

The second frame 120 should necessarily be highly rigid as a structure, and should preferably be lighter than the first frame 110 so that the center of gravity of the main frame 100 becomes low. For this reason, the second frame 120 of this embodiment is made of a metal matrix composite (hereinafter referred to as "MMC") considering the rigidity and weight. MMC is a composite material formed by compounding a reinforcing material such as a ceramic in a metal base, and has the properties of both the metal base and the reinforcing material. More specifically, the second frame 120 employs a MMC material made by compounding 70% aluminum (Al) and 30% silicon carbide (SiC). This MMC material has a Young's modulus of 125 GPa and a specific gravity of 2.8, and it enables high rigidity and lighter weight of the second frame 120 to be realized.

In this manner, the main frame 100 is constituted by connecting the first frame 110 formed in an inversed arch shape and the second frame 120 formed in an arch shape. Thus, compared to the conventional main frame 500, the rigidity of the main frame 100 can be increased.

That is, the conventional main frame 500 (see FIG. 4) was constructed by connecting the flat-plate type first frame 510 and a second frame 520 by a plurality of supporting pillars 522, therefore, connecting portions are disposed for connecting the frames 510 and 520 and the supporting pillars 522 at the parts where stress due to vibrations tends to concentrate (that is, at both ends of the supporting pillar 522). The connecting portion has a reduced rigidity compared to a continuous structure because the connecting portion is connected by bolts or the like. Consequently, the rigidity of the main frame 500 depends on the connecting portion, which has low rigidity.

On the other hand, the main frame 100 is constructed by connecting the first frame 100 formed in an inversed arch shape and the second frame 120 formed in an arch shape, therefore, continuous structures are disposed at parts wherein stress due to vibration is likely to concentrate, while connecting parts with low rigidity are disposed at positions where stress concentration does not occur easily. In this manner, the rigidity of the main frame 100 can be improved compared to the conventional main frame 500.

Since the weight of the first frame 110 is made greater than the weight of the second frame 120, the center of gravity of the main frame 100 can be lowered and the main frame 100 can be supported in a stable condition. Particularly, since FCD450 having a specific gravity of 7.1 is used as the material constituting the first frame 110, and an MMC material having a specific gravity of 2.8 is used as the material constituting the second frame 120, the specific gravity of the material of the first frame 110 is greater than the specific gravity of the material of the second frame 120, and thus the weight of the first frame 110 can be easily made greater than the weight of the second frame 120.

Further, constituting the main frame by connecting the first frame 110 formed in the shape of an inversed arch and the second frame 120 formed in the shape of an arch facilitates maintenance tasks compared to the conventional case.

For instance, in order to remove the projection optical system 30 from the exposure apparatus ST or ST2, the connections of the first frames 110 or 510, and the second frames 120 or 520, needs to be removed, and the second frames 120 or 520 needs to be lifted upward of the projection optical system 30.

In this case, since the supporting pillar 522 of the second frame 520 in the conventional main frame 520 is long, the second frame 520 needs to be raised higher than the length of supporting pillar 522.

On the other hand, in the case of the main frame 100, since the distance along the height direction of the second frame 120 is short, the second frame 120 needs to be raised over a shorter distance compared to the conventional case. Therefore, the projection optical system 30 can be removed from the exposure apparatus ST even at locations where the height to the ceiling is not sufficient, such as in clean rooms where the exposure apparatuses ST and ST2 are installed. This enables the maintenance period to be shortened and expenses thereof to be reduced. As a result, the availability of the exposure apparatus ST can be improved and the production efficiency can be enhanced.

Since the main frame 100 comprising the first frame 110 and the second frame 120 mainly specifies the distance between the projection optical system 30 and the reticle supported on the reticle stage 20, even if the temperature of the surroundings changes, the distance between the projection optical system 30 and the reticle should remain unchanged and stable. However, as mentioned above, considering the balance between rigidity and weight of this embodiment as a structure, cast iron (FCD450 with a coefficient of thermal expansion of $11.6 \times 10^{-6}$/K) is used as the material of the first frame 110, while an MMC material (Al (70%)+SiC (30%)) with a coefficient of thermal expansion of $14.4 \times 10^{-6}$/K) is used as the material of the second frame 120. The coefficient of thermal expansion of these materials is greater than that of low thermal expansion alloys used conventionally (so-called invar (invariable alloy) with a coefficient of thermal expansion of $1 \times 10^{-6}$/K), therefore, when the temperature of the surroundings changes, the distance between the projection optical system 30 and the reticle changes, and as a result, the image focus location may be misaligned. Further, since the coefficients of thermal expansion of the first frame 110 and the second frame 120 are different, a bi-metal effect may occur, which may cause distortion of the main frame 100 due to temperature changes of the surroundings.

In this embodiment, a temperature regulating device 70 is installed to thermally stabilize the first frame 110 and the second frame 120 even if the temperature of the surroundings changes. The temperature regulating device 70 comprises heat sinks 71 disposed at specific positions (details given later) of the first frame 110 and the second frame 120 and a temperature regulating fluid supply unit 72. The temperature regulating fluid supply unit 72 adjusts the temperature of the temperature regulating fluid with high precision and supplies it to the heat sinks 71. The heat sinks 71 are members provided with a flow path for flow of a temperature regulating fluid therewithin, and is in contact with the first frame 110 and the second frame 120. The temperature regulating fluid that passes through the heat sinks 71 returns to the temperature regulating fluid supply unit 72, and the temperature is regulated again. This enables the temperature of the first frame 110 and the second frame 120 to be maintained constant and to remain unaffected by the temperature of the surroundings.

The heat sinks 71 are disposed at a location where temperature changes in the first frame 110 and the second frame 120 are to be suppressed, that is, at locations where the effect of the temperature change of that location is large on the distance between the projection optical system 30 and the reticle. More specifically, as shown in FIG. 1, the heat sinks 71 are disposed in the part connecting the lens barrel support bed 111 and the first frame connecting portion 112 in the first frame 110, and in the part connecting the support bed 121 and the second frame connecting portion 122 in the second frame 120.

The locations where the heat sinks 71 are disposed are not limited to the aforementioned locations; it may be disposed at other locations. For instance, to prevent the effect of deformation of the first frame 110 from extending to the projection optical system 30 and to thermally stabilize the projection optical system 30, a heat sinks 71 may be installed near the portion supporting the projection optical system 30 on the lens barrel support bed 111.

Further, in the present embodiment, the heat sinks 71 are made as members separate from the first frame 110 and the second frame 120, but flow paths can be formed inside the first frame 110 and the second frame 120, and the temperature regulating fluid can be supplied from the temperature regulating fluid supply unit 72.

Further, in the present embodiment, hydrofluoroether (HFE), a fluorine-based inert fluid, is used as the temperature regulating fluid, but it need not be limited to this fluid and other fluids such as, for example, Fluorinert (registered trademark) or water may be used.

As shown in FIG. 1, a sensor support 130 for a disposing sensor (for instance, auto-focus sensor) 131 for the projection optical system is supported in the first frame 110.

The sensor support 130 is made of invar so as not to cause any adverse effects on the measurements by the sensor 131 for the projection optical system. Invar is a steel material containing about 36% nickel (Ni), and has a coefficient of linear expansion of less than $1 \times 10^{-6}$/K as mentioned above. This value is about one-tenth the corresponding value for typical stainless steel (SUS304), and is extremely small; therefore, problems, such as changes in the measurement positions of the sensor 131 for the projection optical system because of changes in temperature of the surroundings and defects such as deviation of the measured value from the true value can be minimized.

Further, in the conventional case, as shown in FIG. 4, an opening 511 formed in the flat-plate type first frame 510 was formed sufficiently larger than the external form of the projection optical system 30, and in its opening 113, a cylindrical sensor support 530 with a flange was inserted. Further, the projection optical system 30 was inserted within the sensor support 530 so that the first frame 510 indirectly supported the projection optical system 30. In this manner, the reason for that supports the projection optical system via the sensor support 530 is that by assembling the projection optical system 30 and the sensor support 530 disposed with the sensor 131 for the projection optical system integrally, adjustments of the sensor 131 for the projection optical system can be performed beforehand thereby reducing the efforts for adjusting the sensor 131 for the projection optical system after assembly of the exposure apparatus ST2.

However, the modulus of longitudinal elasticity of invar is approximately 115 Gpa, which is low compared to the modulus of longitudinal elasticity of typical steel materials (about 160 to 200 Gpa). Consequently, it is unsuitable as a material for structures supporting heavy objects. Further, as mentioned above, with the increase in the numerical aperture NA of the projection optical system 30, the diameter and the weight of the projection optical system 30 tend to increase. Therefore, it is necessary to make the sensor support 530 larger and to increase the size of the opening 511 for inserting the sensor support 530 in order to support the projection optical system 30 via the sensor support 530.

As a result, the first frame 510 becomes large, but the size and weight of the exposure apparatuses ST and ST2 cannot be increased infinitely because of limitations such as installation location and transportation. Accordingly, the structure to support the projection optical system via the sensor support 530 has become increasingly disadvantageous.

To solve this issue, in the first frame 110, the portion that supports the weight of the projection optical system 30 is separated from the part that ensures stability of measurement of the sensor 131 for the projection optical system. Specifically, the projection optical system is directly supported by the first frame 110 and the sensor support 130 is installed on the underside of the first frame 110. This arrangement enables the diameter of the opening 113 formed in the first frame 110 to be minimized, and thus enables an increase in size of the first frame 110 to be suppressed.

A kinematic mount can be provided between the projection optical system 30 and the first frame 110, and the tilt angle of the projection optical system 30 can be adjusted. Further, to prevent heat transfer to the projection optical system 30, the heat sink 71 may be disposed in the first frame 110, or cooling or temperature regulation may be performed by circulating a fluorine-based inert fluid in the first frame 110, as mentioned above.

Next, the base frame (support structure) 200 is described.

The base frame 200 is placed almost horizontally by the floor surface F of the clean room via legs 211. The base frame 200 comprises a lower frame 210 and an upper frame 220.

The lower frame 210 comprises a bed 212 on which a wafer stage 40 is placed and supporting pillars 213 that extend upward for a specific length in the vertical direction from the bed 212. The bed 212 and the supporting pillars 213 form an integral structure and are not connected by any connecting member or the like to form a structure.

The upper frame 220 comprises supporting pillars 221 of the same number of that of the supporting pillars 213, and a beam 222 that connects the upper part of the supporting pillars 221. The supporting pillars 221 and the beam 222 form an integral structure, and are not connected by any connecting member or the like to form a structure.

The supporting pillars 213 and 221 are fastened by bolts or the like. Thus, the base frame 200 becomes a so-called rigid-frame structure (see FIG. 3), and its rigidity can be increased compared to a conventional base frame 600 comprising only a bed 601 and supporting pillars 602 that extends in the vertical direction from the upper surface of the bed 601.

Further, the supporting pillars 213 and 221 are approximately of the same length and are fastened together. Therefore, a continuous structure is disposed in the part (root part of each of the supporting pillars 213 and 221) where stress concentration is likely to occur easily due to the vibration of the exposure apparatus ST, and a connecting part with low rigidity is disposed at the position where stress does not concentrate easily. In this manner, the rigidity of the base frame 200 can be improved compared to the conventional base frame 200.

Consequently, if approximately the same rigidity as in the conventional case is to be maintained, the supporting pillars 213 and 221 can be made more slender compared to the conventional supporting pillar 602, or a circular or square supporting pillar can be changed to a supporting plate-shaped or L-shaped pillar.

The base frame 200 is divided into two upper and lower parts, namely the lower frame 210 and the upper frame 220 because of the limitations on machining of the base frame 200. By dividing base frame 200 into upper and lower frames, the machining of the lower frame 210 and the upper frame 220 (particularly machining of the inside face) becomes easy. The lower frame 210 and the upper frame 220 may be cut into the upper and lower parts after forming an integral structure (such as by casting), alternatively each may be formed separately.

Incidentally, a beam for connecting the supporting pillars 602 to the base frame 600 in the conventional case is not provided because the length (height) of the supporting pillar 602 is small, and if a beam is provided, the opening for maintenance of the wafer stage 40 disposed in the base frame 600 after assembly of exposure apparatus ST2 will become small, thereby making maintenance difficult.

On the other hand, in the base frame 200, the first frame 110 is formed in an inversed arch shape; therefore, the position for supporting the main frame (position for installing the vibration suppression unit 150) is higher than in the conventional case. As a result, the supporting pillars 213 and 221 become long, and even if the beam 222 is provided, a sufficient opening size for maintenance of the wafer stage 40 can be ensured. Further, by disposing the beam 222 and the lens barrel support bed 111 of the first frame 110 at approximately the same height (see FIG. 1 and FIG. 2), the opening size can be made adequately large.

Further, when a reticle loader 61 and a wafer loader 62, and a control system (not shown) are disposed in front of the exposure apparatus ST (left side of FIG. 1), and when a coater developer 70 is disposed further in front thereof (left side), maintenance can be performed through the opening provided on the side face of the base frame 200 (the direction along the plane of the paper in FIG. 1) and the opening formed in the main frame 100. Therefore, the shapes of the base frame 200 and the main frame 100 can be effectively utilized.

As mentioned above, the size and the weight of the wafer stage have a tendency to increase with the increase in the size of the wafer. For this reason, the supporting pillars 602 need to be disposed on the outside of the wafer stage 40 in the conventional main frame 500, the distance between the supporting pillars 602 is increased, and the first frame 510 becomes large; therefore, the rigidity of the first frame 510 is reduced, and the weight of the exposure apparatus ST2 increases.

On the other hand, the supporting pillars 213 and 221 can be made more slender in the base frame 200 compared to the conventional case; or, plate-shaped or L-shaped supporting pillars can be formed, therefore, the supporting pillars 213 and 221 can be disposed more freely compared to the conventional supporting pillars. Consequently, the increase in size of the base frame 200 can be minimized. Further, by disposing a vibration suppression unit 150 on the beam 222, support can be provided without increasing the size of the first frame 110. Thus, the increase in weight of the exposure apparatus ST can be minimized.

The operating procedures indicated in the embodiments mentioned above, or the various shapes of components or their combinations are examples, and various kinds of changes based on process conditions or design requirements may be made within the scope of the spirit of the present invention. The present invention may include, for instance, changes as described below.

The reticle stage need not be limited to a single holder type reticle stage using one reticle as in this embodiment, but may be a double holder type reticle stage holding two reticles on one movable stage, or a double reticle stage wherein two reticles are placed in mutually independent movable stages.

As an exposure apparatus to which the present invention is applied, a step-and-repeat type exposure apparatus may be used wherein the mask pattern is exposed when the mask and substrate are not moved, and the substrate is moved by steps sequentially.

Further, as an exposure apparatus to which the present invention is applied, a proximity exposure apparatus may be used wherein the mask pattern is exposed after the mask and the substrate are brought into close contact without using a projection optical system.

Further, the exposure apparatus may not be limited in its application to only the manufacture of semiconductor devices, but may be used widely for instance, to an exposure apparatus for liquid crystals that expose patterns of a liquid crystal display elements on rectangular glass plates, or to an exposure apparatus for manufacturing thin film magnetic heads.

The light source of the exposure apparatus to which the present invention is applied may use not only g-line (436 nm), i-line (365 nm), KrF excimer laser (248 nm), ArF excimer laser (193 nm), and $F_2$ laser (157 nm), but may also use charged particle rays such as X-rays, electronic beams, and the like. For example, thermal electron emission type lanthanum hexaboride (LaB$_6$) or tantalum (Ta) may also be used as the electron gun when an electron beam is used. Further, when an electron beam is used, a configuration that uses the mask may be adopted, or a configuration wherein the pattern is formed directly on the substrate without using the mask may be adopted. Further, the magnification of the projection optical system is not limited to a reducing system, but it may be an equivalent size or an enlarging system.

In addition, in the case of using far-ultraviolet rays such as an excimer laser or the like for the projection optical system, a material such as quartz or fluorite may be used that allows ultraviolet rays to pass through as a glass material, and in the case of using F$_2$ laser or X-rays, an optical system such as a catadioptric or dioptric system may be used (in this case, the reticle is also a reflective type reticle), and in the case of using an electron beam, an electron optical system composed of an electron lens and deflector may be used as the optical system. Further, it is to be understood that the path through which the electron beam passes should be in a vacuum.

In the case of using a linear motor in the wafer stage and the reticle stage, an air floating system that uses air bearings or a magnetic floating system that uses Lorentz force or reactance force may be used. In addition, a stage may be of a type that moves along guides, or may be a guide-less type wherein guides are not provided. Further, in the case of using a linear motor as the driving device of a stage, either a magnet unit (permanent magnet) or an armature unit may be connected to the stage, while the other of the magnet unit or armature unit should be provided on the moving surface side (base) of the stage.

The reaction force generated by movement of the wafer stage may be released mechanically using a frame member to the floor (earth), as disclosed in Japanese Unexamined Patent Application, First Publication No. H08-166475.

The reaction force generated by movement of the reticle stage may be released mechanically using a frame member to the floor (earth), as disclosed in Japanese Unexamined Patent Application, First Publication No. H08-330224.

Further, the exposure apparatus to which the present invention is applied is manufactured by assembling each of the subsystems that contain each of the components listed in the claims of the present application so as to maintain a predetermined mechanical precision, electrical precision, and optical precision. To ensure each of these precisions, adjustments for achieving optical precision for each type of optical system, adjustments for achieving mechanical precision for each type of mechanical system, and adjustments for achieving electrical precision for each type of electrical system are carried out before and after assembly. The process for assembling the exposure apparatus from the various subsystems includes mechanical connections, electrical circuit wiring connections, and pneumatic circuit line connections between the various subsystems. It is to be understood that there is an assembly step for each subsystem before the process for assembling the exposure apparatus from the various subsystems. Once the process for assembling the exposure apparatus from the various subsystems has been completed, overall adjustments are performed to ensure various precisions for the entire exposure apparatus. Further, the exposure system should preferably be manufactured in a clean room where temperature, cleanliness, and the like are controlled.

In addition, semiconductor devices are manufactured after passing through various steps such as the step for design of functions and performance of device, step for producing the mask (reticle) based on the steps of the aforementioned design, the step for producing wafers from silicon material, the wafer processing step wherein reticle patterns are exposed to wafer using the exposure apparatus of embodiments described above, the device assembly step (including the dicing step, bonding step, packaging step), the inspection step and so forth.

INDUSTRIAL APPLICABILITY

The present invention is an exposure apparatus comprising a projection optical system that irradiates exposure light emitted from a mask onto a substrate, a first support member that supports the projection optical system, and a support structure that supports the first support member. The position at which the support structure supports the first support member is higher than the position at which the first support member supports the projection optical system. Therefore, the first support member is formed in an approximately inversed arch shape enabling the vibration of the projection optical system to be reduced, enabling the rigidity of the main frames composed of a first support member as a component to be enhanced, and enabling high rigidity to be obtained in the support structure.

The invention claimed is:

1. An exposure apparatus comprising:
    a projection optical system that irradiates exposure light emitted from a mask onto a substrate;
    a first support member that supports the projection optical system;
    a vibration suppression device that actively suppresses vibration of the first support member; and
    a support structure that supports the first support member via the vibration suppression device,
    wherein a position at which the vibration suppression device supports the first support member is higher than a position at which the first support member supports the projection optical system, and the vibration suppression device eliminates vibration in a height direction.

2. The exposure apparatus according to claim 1, wherein the position at which the vibration suppression device supports the first support member is approximately at the same height as a position of a center of gravity of the projection optical system.

3. The exposure apparatus according to claim 1, further comprising a sensor support to which a sensor for the projection optical system is disposed,
    wherein the sensor support is disposed on an under surface of the first support member.

4. The exposure apparatus according to claim 1, further comprising:
    a mask stage that retains a mask; and
    a second support member that supports the mask stage,
    wherein the second support member is connected to the first support member at the position where the support structure supports the first support member.

5. The exposure apparatus according to claim 4, wherein the first support member has a weight greater than that of the second support member.

6. The exposure apparatus according to claim 4, wherein a material having higher specific gravity than that of a material of the second support member is used for the first support member.

7. The exposure apparatus according to claim 6, wherein the material of the second support member is a metal matrix composite.

8. The exposure apparatus according to claim 4, wherein a temperature regulating unit is provided in at least one of the first support member and in the second support member.

9. The exposure apparatus according to claim 1, wherein the support structure comprises a bed that supports a substrate stage, a plurality of supporting pillars that supports the first support member, and at least one beam connecting upper parts of the supporting pillars, and wherein the positions at which the beam and the first support member support the projection optical system are set such that they are approximately at the same height.

10. The exposure apparatus according to claim 9, wherein the supporting pillars are divided at a central part into upper and lower parts that are connected at the central part.

11. The exposure apparatus according to claim 1, wherein the support structure supports a substrate stage that holds the substrate, and the first support member is vibrationally isolated from the substrate stage.

12. The exposure apparatus according to claim 1, wherein the vibration suppression device eliminates vibration in a direction intersecting the height direction.

13. An exposure apparatus comprising:

a projection optical system that irradiates exposure light emitted from a mask onto a substrate;

a mask stage that retains the mask;

a first support member that supports the projection optical system;

a second support member that supports the mask stage;

a vibration suppression device that suppresses vibration of the first support member; and a support structure that supports the first support member via the vibration suppression device, wherein a position at which the vibration suppression device supports the first support member is higher than a position at which the first support member supports the projection optical system, the first support member includes an arch shape, and the second support member includes an inverse arch shape relative to the arch shape of the first support member.

14. The exposure apparatus according to claim 13, wherein the first support member supports the second support member.

* * * * *